(12) United States Patent
Khemka et al.

(10) Patent No.: US 7,329,566 B2
(45) Date of Patent: Feb. 12, 2008

(54) SEMICONDUCTOR DEVICE AND METHOD OF MANUFACTURE

(75) Inventors: Vishnu K. Khemka, Phoenix, AZ (US); Amitava Bose, Tempe, AZ (US); Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 305 days.

(21) Appl. No.: 11/142,111

(22) Filed: May 31, 2005

(65) Prior Publication Data

US 2006/0267089 A1    Nov. 30, 2006

(51) Int. Cl.
*H01L 21/332* (2006.01)
*H01L 21/336* (2006.01)

(52) U.S. Cl. .................... 438/133; 438/197

(58) Field of Classification Search ............ 438/133, 438/197, E21.332, E21.336, E21.409–E21.449; 257/262

See application file for complete search history.

(56) References Cited

U.S. PATENT DOCUMENTS

| | | | | |
|---|---|---|---|---|
| 4,825,275 A | * | 4/1989 | Tomassetti | ............ 257/370 |
| 5,126,806 A | | 6/1992 | Sakurai et al. | |
| 5,343,052 A | | 8/1994 | Oohata et al. | |
| 5,920,087 A | | 7/1999 | Nakagawa et al. | |
| 5,977,569 A | | 11/1999 | Li | |
| 6,133,107 A | * | 10/2000 | Menegoli | ............ 438/306 |
| 6,831,331 B2 | * | 12/2004 | Kitamura et al. | ............ 257/343 |
| 2002/0005559 A1 | | 1/2002 | Suzuki | |
| 2004/0084744 A1 | | 5/2004 | Khemka et al. | |

* cited by examiner

*Primary Examiner*—Theresa T Doan
(74) *Attorney, Agent, or Firm*—Ingrassia, Fisher & Lorenz, P.C.

(57) ABSTRACT

A semiconductor component and method of manufacture, including an insulated gate bipolar transistor (IGBT) (100, 200) that includes a semiconductor substrate (110) having a first conductivity type and buried semiconductor region (115) having a second conductivity type located above the semiconductor substrate. The IGBT further includes a first semiconductor region (120) having the first conductivity type located above the buried semiconductor region, a second semiconductor region (130) having the second conductivity type located above at least a portion of the first semiconductor region, an emitter (150) having the second conductivity type disposed in the second semiconductor region, and a collector (170) having the second conductivity type disposed in the first semiconductor region. A sinker region (140) is provided to electrically tie the buried semiconductor region (115) to the second semiconductor region (130). In a particular embodiment, the second semiconductor region and the buried semiconductor region deplete the first semiconductor region in response to a reverse bias potential applied across the semiconductor component.

6 Claims, 2 Drawing Sheets

SEMICONDUCTOR DEVICE AND METHOD OF MANUFACTURE

FIELD OF THE INVENTION

The present invention generally relates to semiconductor components, and more particularly to semiconductor transistors and methods of manufacture.

BACKGROUND OF THE INVENTION

Power devices are electronic components designed to be tolerant of the high currents and voltages that are present in power applications such as motion controlled air bag deployment and automotive fuel injector drivers. The power lateral double-diffused metal-oxide-semiconductor (LDMOS) field-effect-transistor (FET) device, referred to herein as a power LDMOS device, is becoming increasingly popular for such power applications. As power technologies develop, power applications require smaller and smaller power devices with a high breakdown voltage.

Many applications for power LDMOS devices require the inclusion of a series connected reverse diode on certain output nodes in order to realize voltage blocking capability in both positive and negative directions. When the application cannot tolerate the LDMOS body diode, such as when there is a regular output with no reverse path from the output to the input, a discrete diode in series with the LDMOS or two back-to-back LDMOS structures are used to achieve high breakdown voltage in both directions. There exists a problem with device mismatch when multiple LDMOS devices are required or an LDMOS-diode structure is required. In these types of devices a certain percentage of mismatch is expected. Insulated gate bipolar transistors (IGBTs) provide for an alternative structure.

IGBTs are designed for power applications and combine metal-oxide-semiconductor (MOS) gate control and a bipolar current flow mechanism. An IGBT incorporates features of both a metal-oxide-semiconductor field effect transistor (MOSFET) and a bipolar junction transistor (BJT). IGBTs have higher current density than MOSFETs and faster switching characteristics than BJTs. IGBTs are the primary choice today for high-power (>10 kW), low to medium frequency (up to 30 kHz) applications.

IGBT devices feature high current/high voltage operation and high input impedance at the same time. Replacing power LDMOS multi-structures with an insulated gate bipolar transistor (IGBT) provides significant savings in the required device area. That is, IGBT devices are significantly smaller than an LDMOS-diode structure or a LDMOS-LDMOS structure because the on-resistance in an IGBT is lower.

In addition, conventional LDMOS devices suffer from minority carrier current in to the substrate which can harm the surrounding devices. IGBT device structures are less susceptible to such substrate injection. IGBTs typically, do not have the same reverse recovery time associated with a standard LDMOS body diode.

Accordingly, it is desirable to provide a high voltage IGBT structure for silicon bulk based (non silicon-on-insulator (SOI)) power integrated circuits (ICs). Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals indicate like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Existing technology attempts to satisfy the high breakdown voltage requirement in power devices by utilizing a power device having a reduced surface field (RESURF) structure. A power device having a RESURF structure comprises: (1) a first semiconductor region that serves as a RESURF region, having a first conductivity type; and (2) a second semiconductor region that serves as a drift region having a second conductivity type. The RESURF region depletes the drift region, thus reducing the electric field in the drift region and allowing a higher breakdown voltage for the power device. This type of RESURF structure is referred to herein as a "single RESURF" structure.

An IGBT power device having a single RESURF structure comprises a RESURF transistor that includes a semiconductor substrate having a first conductivity type and a buried semiconductor region having a second conductivity type located above the semiconductor substrate. The RESURF transistor further includes a first semiconductor region having the first conductivity type and a second semiconductor region having the second conductivity type located above the buried semiconductor region. The second semiconductor region is expected to be at the same electrical potential as the buried semiconductor region which can be accomplished by typing the second semiconductor region to the buried semiconductor region either internally via a diffusion or externally through metallization. In the single RESURF transistor, the buried semiconductor region and the second semiconductor region deplete the first semiconductor region, which serves as the drift region, thereby reducing the electric field in the first semiconductor region and allowing higher breakdown voltages.

Figure 1:
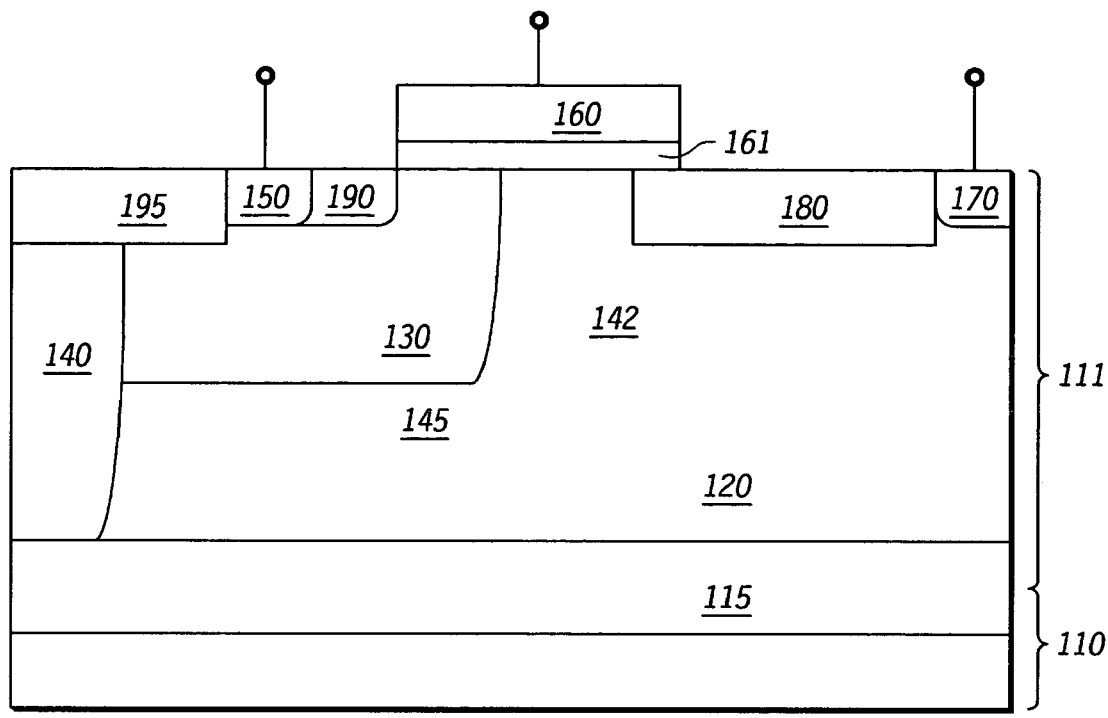
FIG. 1 is a cross-sectional view of a portion of a transistor according to an embodiment of the invention.

Referring now to the drawings, FIG. 1 is a cross-sectional view of a portion of a transistor according to an embodiment of the invention. IGBT 100 is a portion of a discrete semiconductor component or an integrated circuit.

IGBT 100 includes a composite substrate comprising a semiconductor region or substrate 110 and a semiconductor epitaxial layer 111 deposited on substrate 110 by epitaxial growth. A buried semiconductor region 115 is partially located in semiconductor epitaxial layer 111 and partially in semiconductor substrate 110. A semiconductor region 120 is located in semiconductor epitaxial layer 111 and above buried semiconductor region 115. A semiconductor region 130 is located in semiconductor epitaxial layer 111 and generally above semiconductor region 120. Semiconductor substrate 110 and semiconductor region 120 have a first conductivity type. Buried semiconductor region 115 and semiconductor region 130 have a second conductivity type.

IGBT 100 further includes a sinker region 140. Sinker region 140 in this preferred embodiment has a second conductivity type. Sinker region 140 is disposed within semiconductor region 120. Sinker region 140 is an electrically conductive region having a low resistance path and provides electrical contact of region 130 to buried layer 115, a conductive region buried in the integrated circuit. Sinker region 140 is comprised of a heavily doped impurity region. In one embodiment, IGBT 100 is isolated since buried layer 115 is internally tied to emitter 150 through body region 130 and sinker region 140.

In a particular embodiment of IGBT 100, semiconductor substrate 110 comprises a P-type semiconductor substrate and semiconductor epitaxial layer 111 comprises a P-type epitaxial layer deposited on semiconductor substrate 110. Buried semiconductor region 115 comprises a heavily-doped N-type buried layer. Semiconductor region 120 comprises a P-type semiconductor region and defines a drift region. Semiconductor region 130 comprises a N-type body region and sinker region 140 comprises a heavily doped N+ region.

Buried semiconductor region 115 is formed under an active area 145 of IGBT 100. Active area 145 comprises semiconductor region 130 and semiconductor region 120. In the embodiment illustrated in FIG. 1, buried semiconductor region 115 is continuous under all of active areas 145 of IGBT 100. Buried semiconductor region 115 is electrically tied to a first current terminal or emitter (discussed below) and semiconductor region 130 through sinker region 140. During operation, IGBT 100 operates as a single RESURF device wherein semiconductor region 130 and buried layer 115 deplete a drift region 142 of semiconductor region 120.

IGBT 100 further comprises a first current terminal 150, or an emitter and a second current terminal, or a collector 170. IGBT 100 still further comprises an insulating layer 161 positioned on a surface of epitaxial layer 111 in overlying relationship to doped region 120. Generally, insulating layer 161 overlies the surface within (between) region 130 and an oxide region 180. In a preferred embodiment insulating layer 161 is a silicon dioxide or silicon nitride grown or deposited on the surface of epitaxial layer 111. A layer 160 is deposited on layer 161 and processed in a well known manner to produce a contact which operates as a gate terminal. In a preferred embodiment layer 160 is made of polysilicon.

IGBT 100 further includes an oxide region 180, a contact region 190, and an oxide region 195. Oxide region 180 defines a voltage blocking region of transistor 100. The length of region 180 determines how much voltage can be blocked by transistor 100. Semiconductor region 130 serves as body region. Emitter 150 has the second conductivity type and serves as a contact to the body region 130. Collector 170 has the second conductivity type, and region 190 has the first conductivity type. Contact region 190 provides for channel formation inside semiconductor region 130, under gate 160, and therefore provides MOS gate control. Without the inclusion of region 190, transistor 100 would not operate in that region 190 acts as the source of the MOS gate 160 and enables the MOS gated control. Region 195 is optional and when present would serve to isolate emitter 150 from an isolation (ISO) terminal if positioned nearby.

The reverse bias breakdown voltage of IGBT 100 is governed by the reverse bias breakdown potential between the various regions within IGBT 100. More specifically, when a voltage is applied to a first region having a first conductivity type and a different voltage is applied to a second region having a second conductivity type, a voltage difference is set up between the two regions. The voltage difference is often referred to as a potential difference. A reverse bias breakdown potential is the lowest potential difference that will cause breakdown, meaning the lowest potential difference that will cause a current to flow between the two regions that are reverse biased. A device may cease to function, and may be destroyed, when a voltage greater than the reverse bias breakdown potential is applied between two regions, one of which is externally connected.

If one of the two regions is grounded, the reverse bias breakdown voltage of the device equals the reverse bias breakdown potential between the two regions. An N-type region may be biased at, for example, 20 volts so that the potential difference between the two regions is 20 volts. If this 20-volt potential difference is the lowest potential difference that will cause a reverse bias current to flow between the regions, the 20-volt potential difference then becomes the breakdown potential between the regions. Finally, the reverse bias breakdown voltage would also be twenty volts because that would be, in this example, the lowest voltage that could be placed on the non-grounded N-type region that would cause the reverse bias breakdown of the device.

If a voltage at collector 170 is raised above a voltage at emitter 150 the result will be a reverse bias across IGBT 100. In an embodiment wherein a voltage at collector 170 is raised above a voltage at emitter 150, a collector-to-emitter reverse bias breakdown voltage for IGBT 100 is a breakdown potential between drift region 142 of semiconductor region 120 and buried semiconductor region 115.

N+ sinker 140 allows buried semiconductor region 115 to be internally tied to semiconductor region 130. During operation, semiconductor region 130 and buried semiconductor regions 115 deplete drift region 142 of semiconductor region 120, meaning that IGBT 100 has a single RESURF structure. N+ sinker 140, semiconductor region 130 and buried semiconductor region 115 together deplete first semiconductor region 120 in an orthogonal direction to achieve single RESURF action. An NPN transistor is formed by emitter 150 and semiconductor region 130 (N), semiconductor region 120 (P), and collector 170 (N). Once the device is activated with the help of a MOS gate 160, the NPN transistor turns ON. There are two possible current paths in device 100: a lateral path from collector 170, to first semiconductor region 120, to semiconductor region 130; and a vertical path from collector 170, to first semiconductor region 120 to buried semiconductor region 115. In general, the lateral current path will prevail over the vertical current path.

Figure 2:
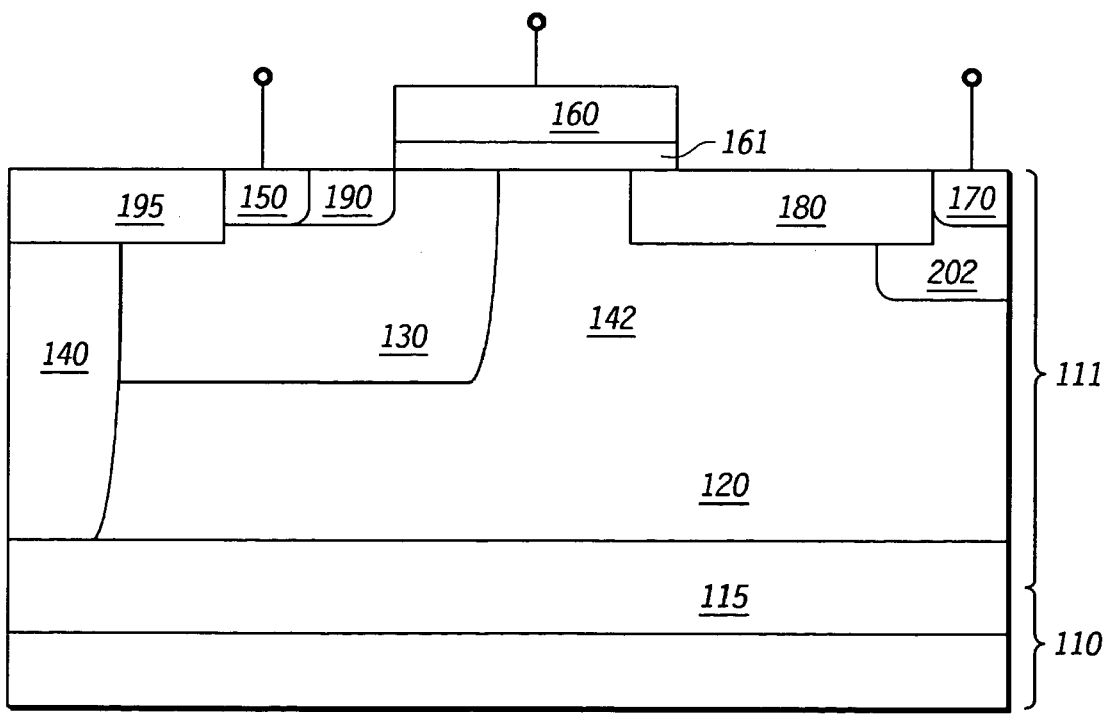
FIG. 2 is a cross-sectional view of a portion of a transistor according to an alternate embodiment of the invention.

FIG. 2 is a cross-sectional view of a portion of an IGBT 200 according to another embodiment of the invention. IGBT 200 is a portion of a discrete semiconductor component or an integrated circuit. IGBT 200 is formed similar to IGBT 100 of FIG. 1 having like numerals to indicate like elements.

In this particular embodiment, IGBT 200 further comprises a buffer region 202 formed in semiconductor region 120. Buffer region 202 provides for increased punch-through prevention and has the same conductivity type as region 120. If a voltage at collector 170 is raised above a voltage at emitter 150, the result will be a reverse bias across IGBT 200. In response to this reverse bias, semiconductor region 120, and more particularly drift region 142, is depleted by both semiconductor region 130 and buried layer 115. In absence of buffer region 202, a situation may arise where semiconductor region 120 is completely depleted so that the depletion layer boundary may touch collector 170. This establishes a direct leakage current path between the collector 170 and emitter 150 of IGBT 200. In transistor 200, the presence of buffer region 202 prevents a depletion region from expanding too far and touching collector region 170, thus preventing the formation a leakage current path.

Figure 3:
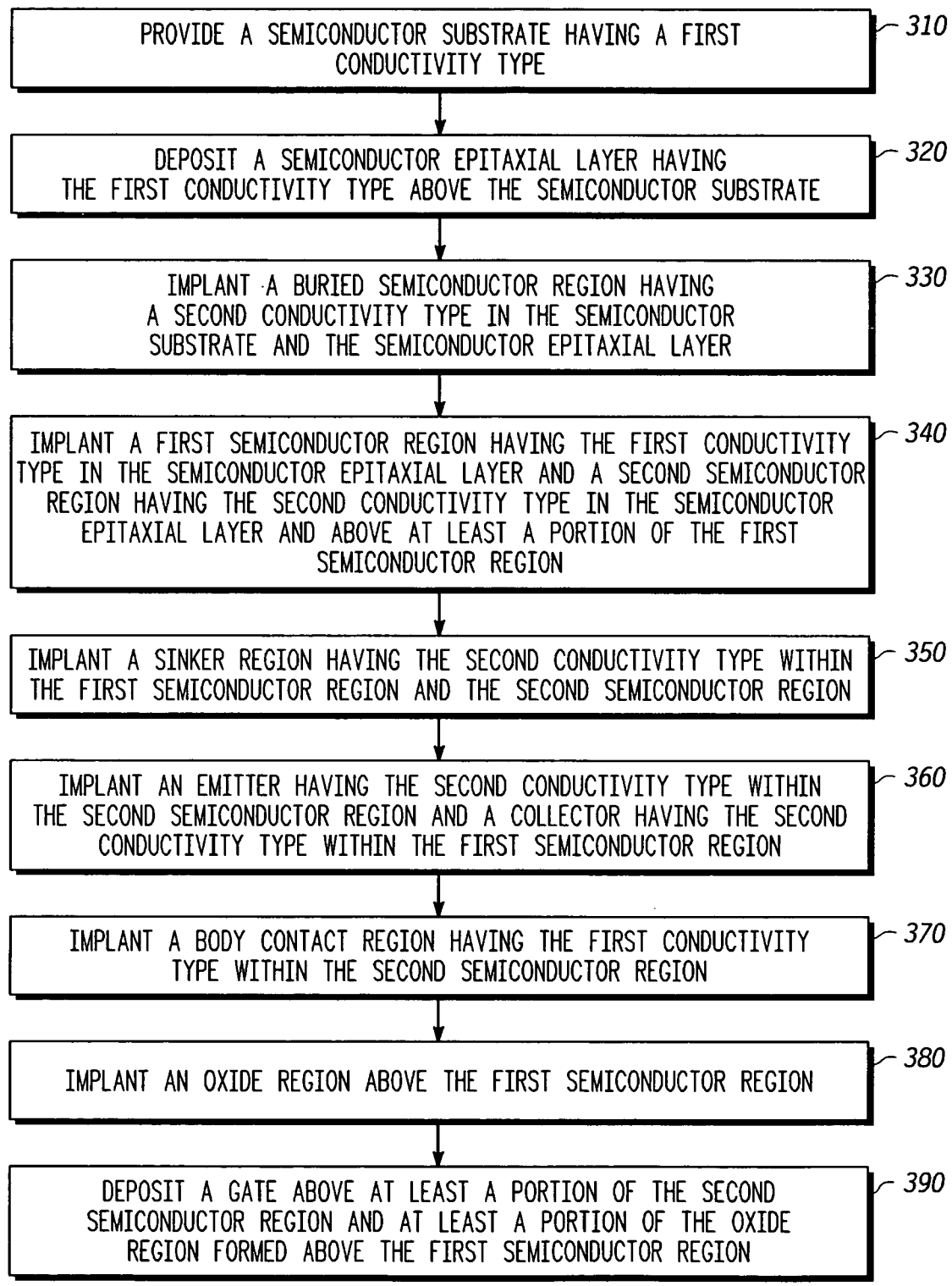
FIG. 3 is a flow diagram illustrating a method of manufacturing a semiconductor component according to an embodiment of the invention.

FIG. 3 is a flow diagram illustrating a method 300 of manufacturing a semiconductor component according to an embodiment of the invention. A first step 310 of method 300 is to provide a semiconductor substrate having a first conductivity type, such as a p-type monocrystalline silicon. As an example, the semiconductor substrate of step 310 can be similar to semiconductor substrate 110 of FIG. 1. While the embodiment described herein are specific to a conductivity type, those skilled in the art will note that n-type doping can substituted for p-type doping, and vice versa when performed throughout the device, in an alternative embodiment.

A step 320 of method 300 is to deposit a semiconductor epitaxial layer having the first conductivity type above the semiconductor substrate. As an example, the semiconductor epitaxial layer can be similar to p-type semiconductor epitaxial layer 111 in FIG. 1. In one embodiment, epitaxial layer 111 is deposited to have a thickness of 1.0 to 10.0 microns. Epitaxial layer 111, in a preferred embodiment, is doped with boron and has a doping concentration between ~1E15 to ~1E16/cm$^3$.

A step 330 of method 300 is to implant a buried semiconductor region having a second conductivity type in the semiconductor epitaxial layer and also, optionally, in the semiconductor substrate. As an example, the buried semiconductor region can be similar to n-type buried semiconductor region 115 in FIGS. 1 and 2, wherein buried semiconductor region 115 comprises a continuous layer of semiconductor material formed under all of an active area of the semiconductor component by ion implantation. The active area comprises portions of subsequent layers. In one embodiment, buried semiconductor region 115 of FIGS. 1 and 2 is formed by ion implantation of antimony and has a doping concentration between ~5E18 to ~5E19/cm$^3$.

A step 340 of method 300 is to form by ion implantation a first semiconductor region having the first conductivity type in the semiconductor epitaxial layer. Alternatively, the first semiconductor region can be a portion of the epitaxial layer. A second semiconductor region having the second conductivity type is formed above the first semiconductor region, wherein the first semiconductor region is located generally between the second semiconductor region and the buried semiconductor region. As an example, the first semiconductor region may be similar to p-type semiconductor region 120 of FIGS. 1 and 2 and the second semiconductor region may be similar to n-type semiconductor region 130 of FIGS. 1 and 2. In one embodiment, semiconductor region 120 is formed by ion-implantation of boron, having a doping concentration of between ~1E156 and ~5E15/cm$^3$. In one embodiment, semiconductor region 130 is formed by ion-implantation of phosphorous, having a doping concentration of between ~1E16 and ~1E17/cm$^3$.

A step 350 of method 300 is to form by ion implantation a sinker region having the second conductivity type within semiconductor region 120. As an example, the sinker region may be similar to n-type sinker region 140 of FIGS. 1 and 2. In one embodiment, sinker region 140 is formed by ion-implantation of phosphorus, having a doping concentration of between 1E17 and 1E19/cm$^3$.

A step 360 of method 300 is to form an emitter having the second conductivity type within the second semiconductor region and a collector having the second conductivity type within the first semiconductor region. As an example, the emitter can be similar to n-type emitter 150 of FIGS. 1 and 2. As a further example, the collector can be similar to n-type collector 170 of FIGS. 1 and 2. In one embodiment, emitter 150 and collector 170 are formed ion-implantation of phosphorus, having a doping concentration of between 1E19 and 1E20/cm$^3$.

A step 370 of method 300 is to form a contact region having the first conductivity type within the second semiconductor region. As an example, the contact region can be similar to p-type contact region 190 of FIGS. 1 and 2. In one embodiment, contact region 190 is ion-implantation of boron, having a doping concentration of between 1E19 and 1E20/cm$^3$.

A step 380 of method 500 is to form oxide regions by oxidation or by trench etch and subsequent oxide fill, above the first semiconductor region and an oxide region above a portion of the second semiconductor region and a portion of the sinker region. As an example, the oxide region formed above the first semiconductor region can be similar to oxide region 180 in FIGS. 1 and 2. The oxide region formed above a portion of the second semiconductor region and a portion of the sinker region can be similar to oxide region 195 in FIGS. 1 and 2. A step 390 of method 300 is to form a gate above at least a portion of the second semiconductor region and at least a portion of the oxide region formed above the first semiconductor region. As an example, the gate can be similar to gate 160 of FIGS. 1 and 2.

Accordingly, provided is a semiconductor component comprising: a lateral insulated gate bipolar transistor (IGBT) comprising: a semiconductor substrate having a first conductivity type; a buried semiconductor region having a second conductivity type and located above the semiconductor substrate; a first semiconductor region having the first conductivity type and located above the buried semiconductor region; a second semiconductor region having the second conductivity type and located above at least a portion of the first semiconductor region; a sinker region having the second conductivity type, disposed above the buried semiconductor region ;an emitter having the second conductivity type and disposed in the second semiconductor region, wherein the sinker region electrically ties the buried semiconductor region to the second semiconductor region and the emitter via the second semiconductor region; and a collector having the second conductivity type and disposed in the first semiconductor region, wherein the second semiconductor region and the buried semiconductor region deplete the first semiconductor region in response to a reverse bias potential applied between the collector and the emitter. The device may further include a buffer region disposed in the first semiconductor region, wherein the buffer region is formed to enclose the collector region. The sinker region is disposed in the first semiconductor region and the second semiconductor region. The buried semiconductor region is electrically tied to a same potential as the second semiconductor region. The buried semiconductor region and the second semiconductor region deplete the first semiconductor region in a drift region. The first conductivity type is P-type and the second conductivity type is N-type. The second semiconductor region and the first semiconductor region form an active area of the lateral insulated gate bipolar transistor (IGBT).

In addition, provided is a semiconductor component comprising an IGBT comprising: a semiconductor substrate having a surface; a semiconductor epitaxial layer above the surface of the semiconductor substrate; an N-type buried semiconductor region in the semiconductor epitaxial layer; a P-type semiconductor region in the semiconductor epitaxial layer and above the N-type buried semiconductor region; an N-type body region in the semiconductor epitaxial layer and above the P-type semiconductor region; an N-type sinker region disposed above the N-type buried semiconductor region; an N-type emitter region disposed in the N-type body region, wherein the N-type sinker region electrically ties the N-type buried semiconductor region and the N-type emitter via the N-type body region; and an N-type collector region disposed in the P-type semiconductor region, wherein the P-type semiconductor region is configured to be depleted in response to a reverse bias potential applied across the IGBT. The N-type buried semiconductor region and the N-type body region deplete the P-type semiconductor region in response to a reverse bias potential applied across the N-type collector region and the N-type body region. The N-type body region and the P-type semiconductor region form an active area of the IGBT. The N-type buried semiconductor region may be continuous under all of the active area of the IGBT. The sinker region is disposed in the P-type semiconductor region and the N-type body region. The device further including a buffer region disposed in the P-type semiconductor region, the buffer region formed to enclose the N-type collector region and having the same conductivity type as the collector.

Finally, provided is a method of manufacturing a semiconductor component comprising: providing a composite substrate comprising a semiconductor epitaxial layer above a semiconductor substrate, the composite substrate having a first conductivity type; forming a buried semiconductor region in the epitaxial layer, having the second conductivity type; forming a first semiconductor region in the epitaxial layer, having the first conductivity type and located above the buried semiconductor region; forming a second semiconductor region in the epitaxial layer having the second conductivity type and located above at least a portion of the first semiconductor region; disposing a sinker region having the second conductivity above the buried semiconductor region; disposing an emitter having the second conductivity type in the second semiconductor region, wherein the sinker region electrically ties the buried semiconductor region and the emitter via the second semiconductor region; and disposing a collector having the second conductivity type in the first semiconductor region, wherein the second semiconductor region and the buried semiconductor region deplete the first semiconductor region in response to a reverse bias potential applied across the semiconductor component. The first conductivity type is P-type and the second conductivity type is N-type. The step of disposing a sinker region above the buried semiconductor region includes disposing the sinker region in the first semiconductor region and the second semiconductor region. The N-type body region and the P-type semiconductor region form an active area of an IGBT. The N-type buried semiconductor region is continuous under all of the active area of the IGBT. The first semiconductor region, the buffer region formed to enclose the collector and having the same conductivity type as the collector.

While a plurality of exemplary embodiments have been presented in the foregoing detailed description, it should be appreciated that additional variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

What is claimed is:

1. A method of manufacturing a semiconductor component comprising:

providing a composite substrate comprising a semiconductor epitaxial layer above a semiconductor substrate, the composite substrate having a first conductivity type;

forming a buried semiconductor region in the epitaxial layer, having the second conductivity type;

forming a first semiconductor region in the epitaxial layer, having the first conductivity type and located above the buried semiconductor region;

forming a second semiconductor region in the epitaxial layer having the second conductivity type and located above at least a portion of the first semiconductor region;

disposing a sinker region having the second conductivity above the buried semiconductor region;

disposing an emitter having the second conductivity type in the second semiconductor region, wherein the sinker region electrically ties the buried semiconductor region and the emitter via the second semiconductor region; and disposing a collector having the second conductivity type in the first semiconductor region, wherein the second semiconductor region and the buried semiconductor region deplete the first semiconductor region in response to a reverse bias potential applied across the semiconductor component.

2. A method of manufacturing a semiconductor component as claimed in claim 1 wherein the first conductivity type is P-type and the second conductivity type is N-type.

3. A method of manufacturing a semiconductor component as claimed in claim 1 wherein the step of disposing a sinker region above the buried semiconductor region includes disposing the sinker region in the first semiconductor region and the second semiconductor region.

4. A method of manufacturing a semiconductor component as claimed in claim 1 wherein the second semiconductor region and the first semiconductor region form an active area of an IGBT.

5. A method of manufacturing a semiconductor component as claimed in claim 1 wherein the buried semiconductor region is continuous under all of the active area of the IGBT.

6. A method of manufacturing a semiconductor component as claimed in claim 1 further including the step of disposing a buffer region in the first semiconductor region, the buffer region formed to enclose the collector and having the same conductivity type as the collector.

* * * * *